United States Patent
Lee (10) Patent No.: US 9,520,401 B2
(45) Date of Patent: Dec. 13, 2016

(54) SEMICONDUCTOR DEVICES CAPABLE OF SELF-CURING

(71) Applicant: SAMSUNG ELECTRONICS CO., LTD., Suwon-si, Gyeonggi-do (KR)

(72) Inventor: Sungsam Lee, Yongin-si (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 81 days.

(21) Appl. No.: 14/197,588

(22) Filed: Mar. 5, 2014

(65) Prior Publication Data

US 2014/0346580 A1   Nov. 27, 2014

(30) Foreign Application Priority Data

May 23, 2013 (KR) .......................... 10-2013-0058470

(51) Int. Cl.
H01L 21/336 (2006.01)
H01L 27/108 (2006.01)
H01L 27/02 (2006.01)

(52) U.S. Cl.
CPC ... *H01L 27/10814* (2013.01); *H01L 27/10823* (2013.01); *H01L 27/10885* (2013.01); *H01L 27/10891* (2013.01); H01L 27/0207 (2013.01)

(58) Field of Classification Search
CPC .................. H01L 27/10891; H01L 27/10814; H01L 27/10823; H01L 27/10885; H01L 27/0207

USPC .......................................... 257/296, 300–306
See application file for complete search history.

(56) References Cited

U.S. PATENT DOCUMENTS

| | | | |
|---|---|---|---|
| 6,171,934 B1 | 1/2001 | Joshi et al. | |
| 6,534,358 B2 | 3/2003 | Nakura et al. | |
| 7,172,946 B2 | 2/2007 | Choi et al. | |
| 2004/0104425 A1* | 6/2004 | Kobayashi | B82Y 10/00 257/321 |
| 2004/0156255 A1* | 8/2004 | Tsukikawa | G11C 11/404 365/206 |
| 2010/0176437 A1* | 7/2010 | Huang | H01L 27/11565 257/324 |
| 2011/0170336 A1 | 7/2011 | Sim | |

FOREIGN PATENT DOCUMENTS

| | | |
|---|---|---|
| KR | 10-2003-0056900 A | 7/2003 |
| KR | 10-2004-0005357 A | 1/2004 |
| KR | 10-2004-0059412 A | 7/2004 |

* cited by examiner

*Primary Examiner* — Brook Kebede
(74) *Attorney, Agent, or Firm* — Lee & Morse, P.C.

(57) ABSTRACT

A semiconductor device includes a plurality of first signal lines crossing a plurality of second signal lines. At least one of the first signal lines has a first end to receive a first voltage and a second end to receive a second voltage. The first and second voltages are applied simultaneously to respective ones of the first and second ends. A difference between the first and second voltages causes joule heating in the at least one first signal line. The joule heating may correct one or more defects in the semiconductor device.

20 Claims, 10 Drawing Sheets

SEMICONDUCTOR DEVICES CAPABLE OF SELF-CURING

CROSS-REFERENCE TO RELATED APPLICATION

Korean Patent Application No. 10-2013-0058470, filed on May 23, 2013, and entitled, "Semiconductor Devices Capable Of Self-Curing," is incorporated by reference herein in its entirety.

BACKGROUND

1. Field

One or more embodiments described herein relate to a semiconductor device.

2. Description of the Related Art

The electrical properties of a semiconductor device may degrade over time as a result of electrical or thermal stress. In an attempt to correct the degradation, the device may be cured using a baking process. In order to cure the device, separate baking equipment and baking process are required. This may increase initial manufacturing costs and result in an overall deterioration productivity. Furthermore, the curing technique may not correct defects after the semiconductor device has been released.

SUMMARY

In accordance with one embodiment, a semiconductor device includes a plurality of word lines; and a plurality of bit lines which cross the word lines, wherein at least one of the word lines includes a first end to which a positive voltage is applied and a second end to which a negative voltage is applied. The semiconductor device may further includes a first wire electrically connected to the first end; and a second wire electrically connected to the second end, wherein the positive voltage is applied to the first end through the first wire, and wherein the negative voltage is applied to the second end through the second wire. The at least one word line may include a dummy or isolation word line.

The semiconductor device may further includes a substrate having active regions, each of the active regions may have an island shape extending in a third direction which crosses a first direction in which the word lines extend and a second direction in which the bit lines extend. The active regions may be arranged in a zigzag pattern in the first direction and partially overlap each other in the first direction. The active regions may be arranged in a row in the first direction and overlap each other in the first direction.

The substrate may include a device isolation layer extending in the first direction, and the at least one word line may be buried in the device isolation layer and extends without crossing the active regions. The substrate may include active regions, each of the active regions having substantially a line shape extending in a third direction which crosses a first direction in which the word lines extend and a second direction in which the bit lines extend.

The substrate may include active regions defined by an isolation layer, wherein the word lines are buried in the device isolation layer and extend in a first direction, and wherein the bit lines are disposed on the substrate and extend in a second direction crossing the first direction.

The semiconductor device may further include capacitors electrically connected to a substrate; node contacts electrically connecting the capacitors to the substrate; and bit line contacts electrically connecting the bit lines to the substrate.

In accordance with another embodiment, a semiconductor device may include a semiconductor substrate including active regions defined by a device isolation layer; word lines extending to cross the active regions in a first direction; and bit lines extending to cross the active regions in a second direction different from the first direction and crossing the word lines, wherein at least one of the word lines is self-heated when voltages are applied to respective ends of the at least one word line, the voltages having polarities different from each other.

The active regions may extend in a third direction crossing the first and second directions and have island shapes arranged in a zigzag pattern in the first direction, the bit lines may extend to cross central portions of the active regions, and the word lines may extend to cross edges of the active regions.

The active regions may extend in a third direction crossing the first and second directions and have island shapes arranged in a row in the first direction, the bit lines may extend to cross central portions of the active regions, and the at least one word line may be buried in the device isolation layer between adjacent ones of the active regions in the second direction and may extend without crossing the active regions, and other word lines extend to cross edges of the active regions.

The active regions may have a line shape extending in a third direction crossing the first and second directions, the word lines and the bit lines may extend to cross the active regions, and at least one word line may electrically isolate adjacent word lines from each other, wherein the at least word line is located between the adjacent word lines. The semiconductor substrate may include a cell block, the at least one word line may be disposed outside the cell block, and other word lines and the bit lines may be disposed within the cell block.

In accordance with another embodiment, a semiconductor device includes a plurality of first signal lines; and a plurality of second signal lines crossing the first signal lines, wherein at least one of the first signal lines has a first end to receive a first voltage and a second end to receive a second voltage, wherein the first and second voltages are applied simultaneously to respective ones of the first and second ends, and wherein a difference between the first and second voltages causes joule heating in the at least one first signal line.

The difference between the first and second voltages may reduce electrical or thermal stress in an area including or adjacent to the at least one first signal line. The first signal lines may be word lines and the second signal lines may be bit lines. The first signal lines may be dummy signal lines. The device may be a memory.

BRIEF DESCRIPTION OF THE DRAWINGS

Features will become apparent to those of ordinary skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

First Embodiment

Figure 1A:
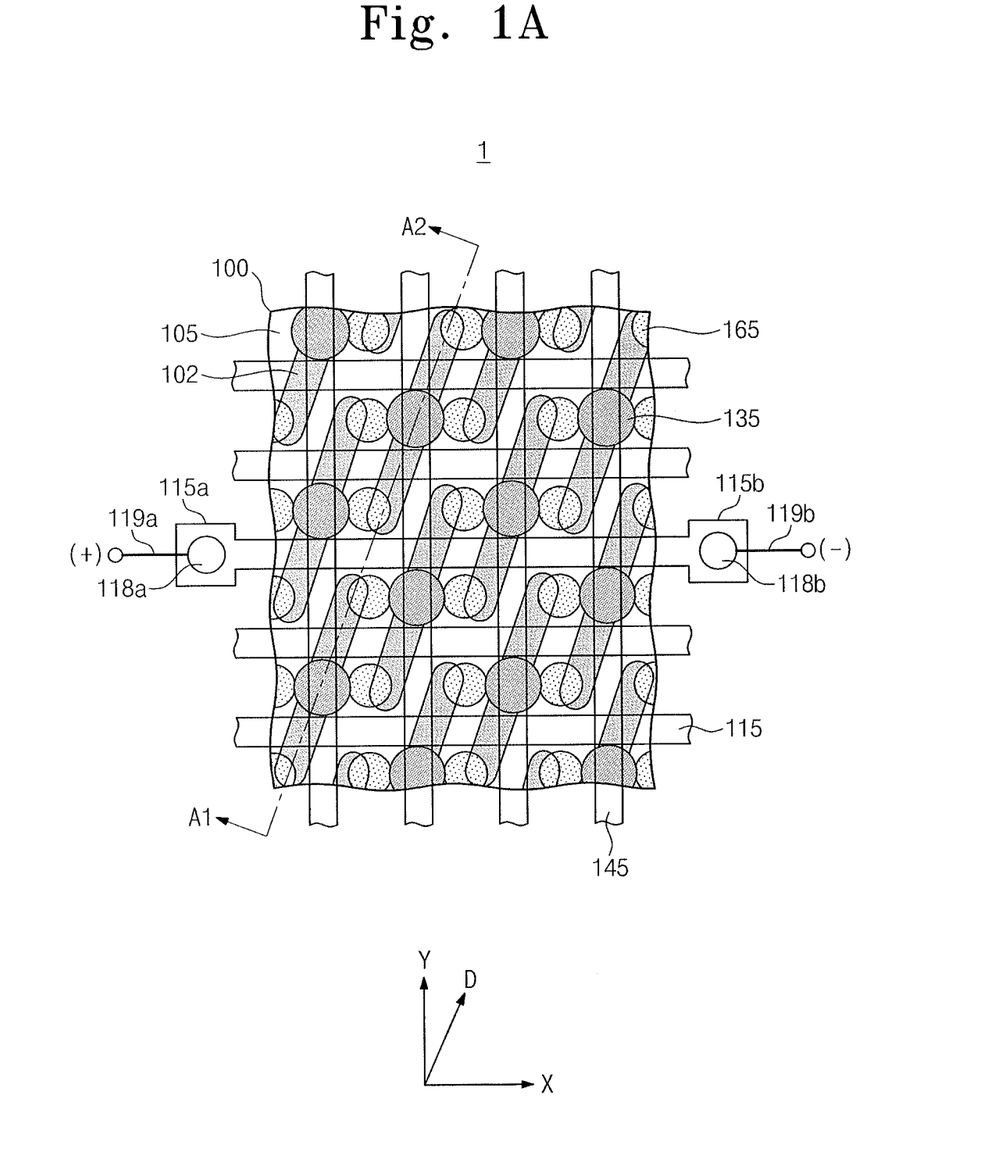
FIG. 1A illustrates an embodiment of a semiconductor device.
Figure 1B:
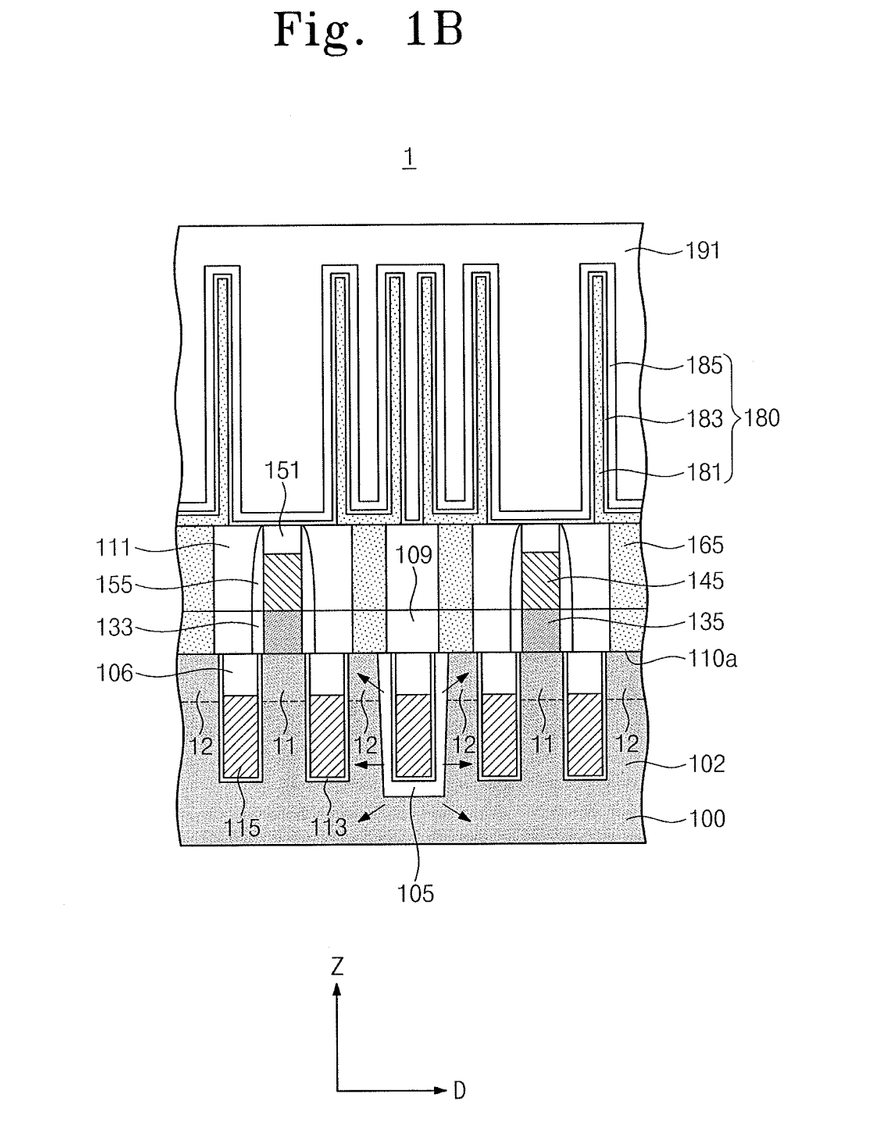
FIG. 1B illustrates a view taken along section line A1-A2 of FIG. 1A.

FIG. 1A illustrates an embodiment of a semiconductor device 1, and FIG. 1B illustrates a cross-sectional view taken along line A1-A2 of FIG. 1A. Referring to FIGS. 1A and 1B, semiconductor device 1 includes a substrate 100 on which a plurality of word lines 115 and a plurality of bit lines 145 are formed. The word lines 115 extend in a first horizontal direction X, and the bit lines 145 extend in a second horizontal direction Y. The semiconductor device 1 further include a plurality of capacitors 180 for storing information. In this embodiment, semiconductor device 1 may therefore be used as a semiconductor memory device.

Additionally, substrate 100 includes a plurality of active regions 102 defined by a device isolation layer 105. For example, substrate 100 may be a semiconductor substrate having a first conductive-type (e.g., p-type) silicon wafer. The active region 102 has a predetermined shape. As shown in FIG. 1A, in one example the predetermined shape may be an island shape extending in a diagonal direction D. In other embodiments, active regions may have a different shape. The diagonal direction may be, for example, perpendicular to the first horizontal direction X and the second horizontal direction Y. As shown in FIG. 1B, active regions 102 may extend in a vertical direction Z. In one example embodiment, active regions 102 are arranged in a zigzag pattern in the first horizontal direction X, so that portions of active regions 102 may overlap each other along the first horizontal direction X.

Each active region 102 may have a portion 11 which overlaps a corresponding bit line 145 in the vertical direction Z. A bit line contact 135 may be disposed on the overlapped portion 11, i.e., a first junction region 11. The active region 102 may have at least one portion 12 which does not overlap the bit line 145 and word line 115 in the vertical direction Z. A node contact 165 may be disposed on the non-overlapped portion 12, i.e., a second junction region 12. The first and second junction regions 11 and 12 may be formed by injecting second conductive-type (e.g., n-type) impurities into upper ends of each active region 102. The bit line contact 135 may electrically connect each of bit lines 145 to the first junction region 11. Node contact 165 may electrically connect each of the capacitors 180 to the second junction region 12.

As shown in FIG. 1B, the word lines 115 may be buried in the substrate 100. Each word line may be covered by a capping insulation layer 105. A gate insulation layer 113 may be interposed between the word line 115 and substrate 100. The first and second junction regions 11 and 12 may be disposed on upper ends of respective side surfaces of each of the word lines 115, thereby defining a channel having a "U" shape.

The bit lines 145 may be disposed on a first interlayer insulation layer 109 covering the substrate 100. For example, bit lines 145 may be buried in a second interlayer insulation layer 111 covering the first interlayer insulation layer 109. Spacers 155 and a capping layer 151 may be respectively disposed on sidewalls and a top surface of each of the bit lines 145. The bit line contact 135 may vertically penetrate the first interlayer insulation layer 109 to contact the first junction region 11 and the bit line 145. A spacer 133 may be disposed on each of sidewalls of the bit line contact 135.

The capacitor 180 includes a dielectric layer 183 between a lower electrode 181 and an upper electrode 185. The capacitor 180 may be disposed on the second interlayer insulation layer 111. The capacitor 180 may be covered by a third interlayer insulation layer 191. The node contact 165 may vertically penetrate the first and second interlayer insulation layers 109 and 111 to contact the second junction region 12 and the lower electrode 181.

According to some embodiments, at least one of the plurality of word lines 115 may be self-heatable. A voltage may be supplied to only one end of each of the plurality of word lines 115 which are not self-heatable.

For example, as shown in FIG. 1A, one end 115a (hereinafter, referred to as a first pad) of at least one word line 115 may be electrically connected to a first wire 119a, to allow a positive voltage to be supplied to first pad 115a of the at least one word line 115. An opposite end 115b (hereinafter, referred to as a second pad) of at least one word line 115 may be electrically connected to a second wire 119b, to allow a negative voltage to be supplied to the second pad 115b.

The first wire 119a may be electrically connected to a positive voltage generation circuit, and the second wire 119b may be electrically connected to a negative voltage generation circuit. The first pad 115a and the first wire 119a may contact each other by a first contact 118a. The second pad 115b and the second wire 119b may contact each other by a second contact 118b. Since the different polarity voltages are supplied to ends of the at least one word line 115, the at least one word line 115 may be joule-heated to generate heat (designated as an arrow of FIG. 1B). The at least one word line 115 may be buried in substrate 100 and device isolation layer 105 to extend in the first horizontal direction X.

The semiconductor device 1 may be degraded in various ways. For example, semiconductor device 1 may be degraded in terms of refresh characteristics due to a change and/or swing of a threshold voltage resulting from Fowler-Nordheim (FN) stress. Additionally, or alternatively, semiconductor device 1 may be degraded in terms of retention time due to thermal stress. These defects may be cured by a baking process.

According to one embodiment, when a defects occurs that causes semiconductor device 1 to be in a degraded state, semiconductor device 1 may be self-curable by joule-heating of one or more word lines 115. This may be performed without loading the semiconductor device 1 into a bake process apparatus. The self-heating may be performed by applying positive and negative voltages to the one or more word lines 115 connected to the first and second wires 119*a* and 119*b*, when semiconductor device 1 is in a standby state.

Modified Examples of the First Embodiment

Figure 1C:
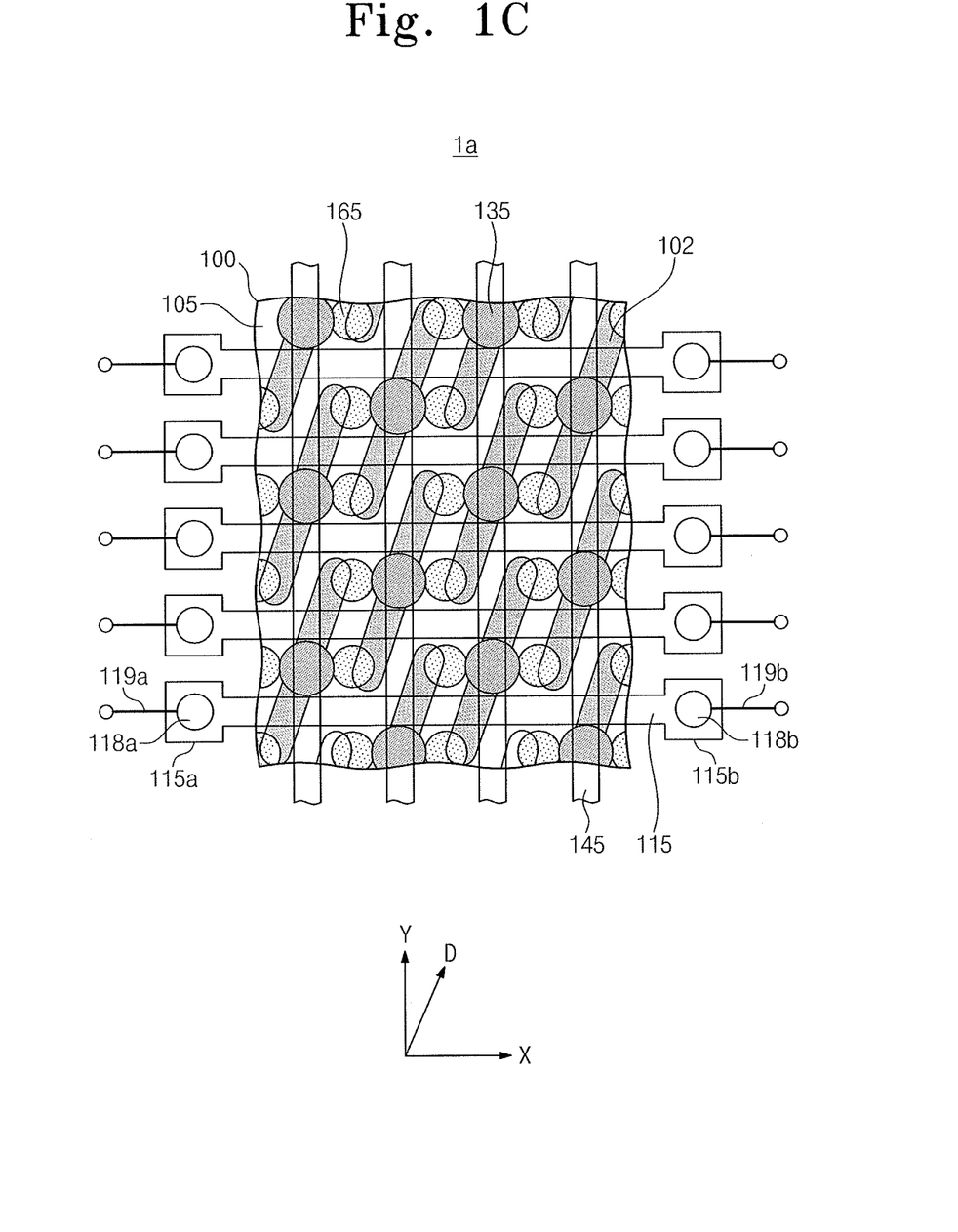
FIGS. 1C to 1E illustrate modified examples of the embodiment in FIG. 1A.
Figure 1D:
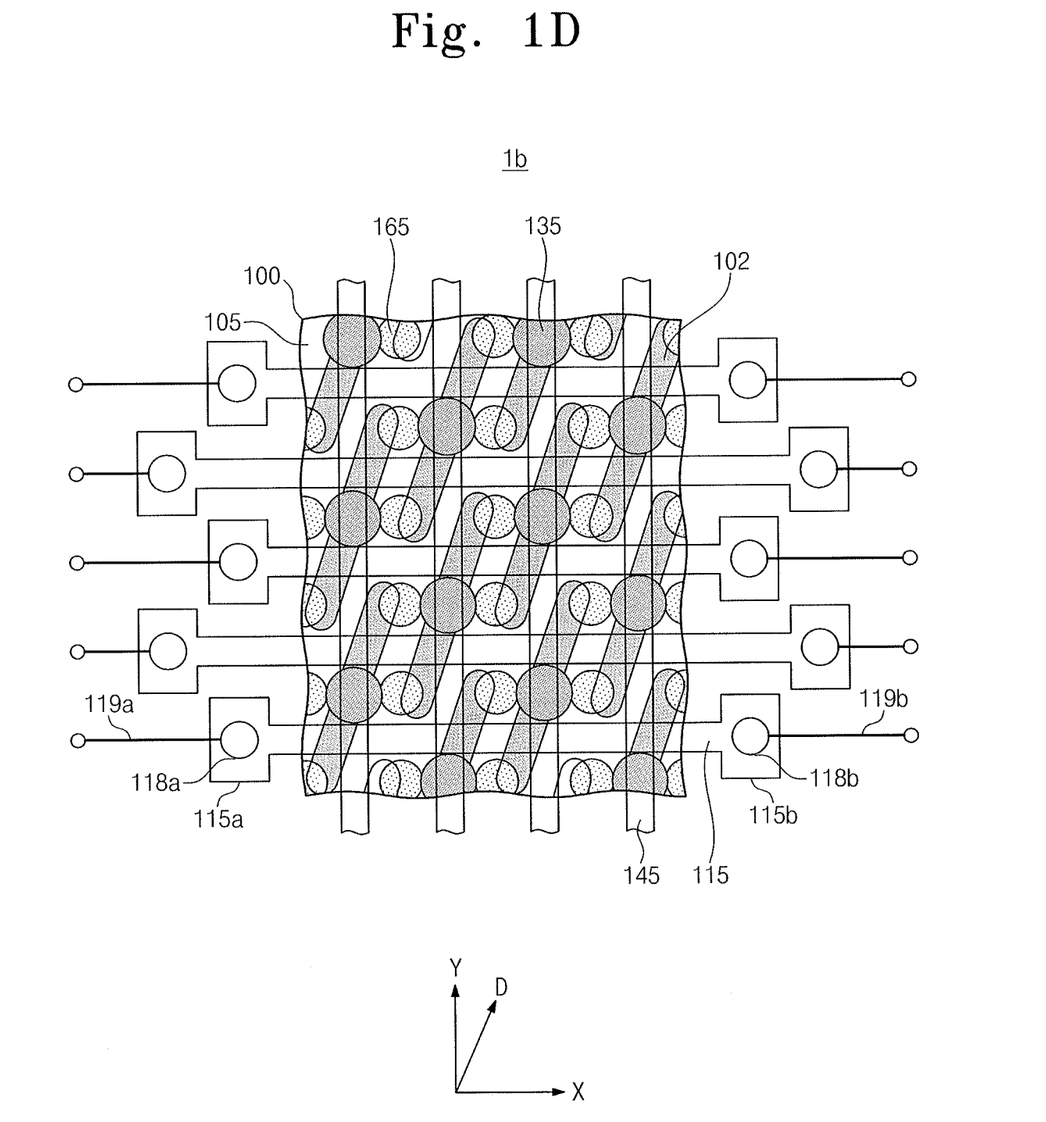
Figure 1E:
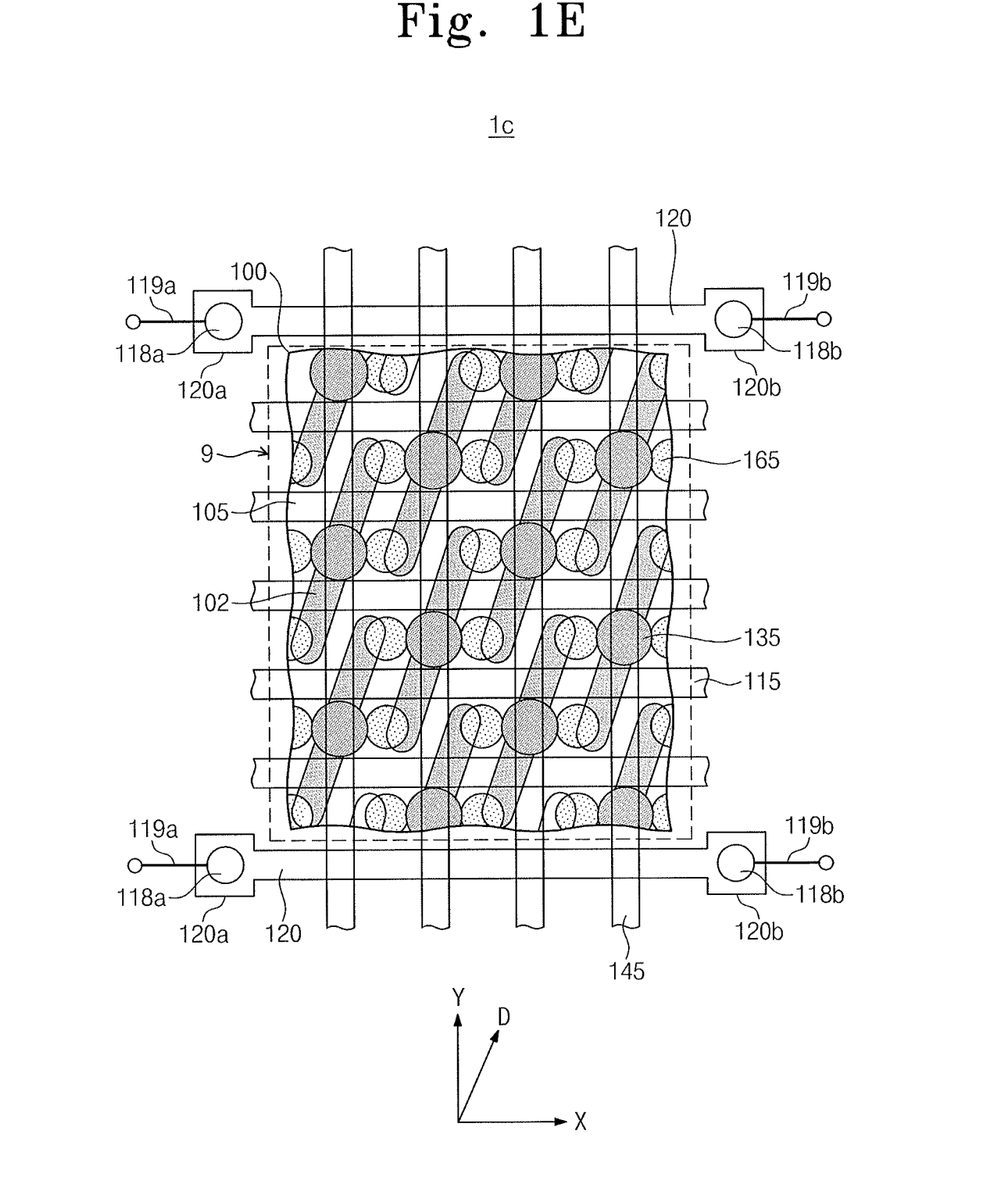

FIGS. 1C to 1E illustrate plan views illustrating modified examples of FIG. 1A.

Referring to FIG. 1C, a semiconductor device 1*a* may include word lines 115 and bit lines 145 which cross each other. All of the word lines 115 may be self-heatable. According to some embodiments, when semiconductor device 1*a* is degraded by a refresh defect and/or retention time defect, positive and negative voltages may be respectively applied to ends of one or more word lines 115. The semiconductor device 1*a* may be baked to be self-cured through heat generated from the one or more word lines 115 applied with voltages. For example, when the defect occurs in a specific cell, the word line 115 that corresponds to the specific cell may be self-heated to self-cure the specific cell. Alternatively, one or more word lines 115 adjacent to word line 115 that corresponds to the specific cell may be self-heated.

Referring to FIG. 1D, a semiconductor device 1*b* may include first pads 115*a* and/or second pads 115*b* arranged in a zigzag pattern in the second horizontal direction Y. For example, if all the word lines 115 are self-heatable, the first pads 115*a* may be arranged in the zigzag pattern to prevent the first pads 115*a* from contacting each other. Similarly, the second pads 115*b* may be arranged in a zigzag pattern in the second horizontal direction Y.

Referring to FIG. 1E, a semiconductor device 1*c* may include at least one dummy word line 120. The at least one dummy word line may be located outside a cell block 9. The at least one dummy word line 120 may be formed together with one or more word lines 115 to achieve a uniform pattern, when word lines 115 are formed within cell block 9. According to some embodiments, the at least one dummy word line 120 may be configured to be self-heatable.

For example, first pad 120*a* of dummy word line 120 may be electrically connected to first wire 119*a* by first contact 118*a*. The second pad 120*b* may be electrically connected to second wire 119*b* by second contact 118*b*.

A voltage may be applied to only one end of word line 115 within cell block 9. Alternatively, at least one or all of the word lines 115 within cell block 9 may be configured to be self-heatable.

Second Embodiment

Figure 2A:
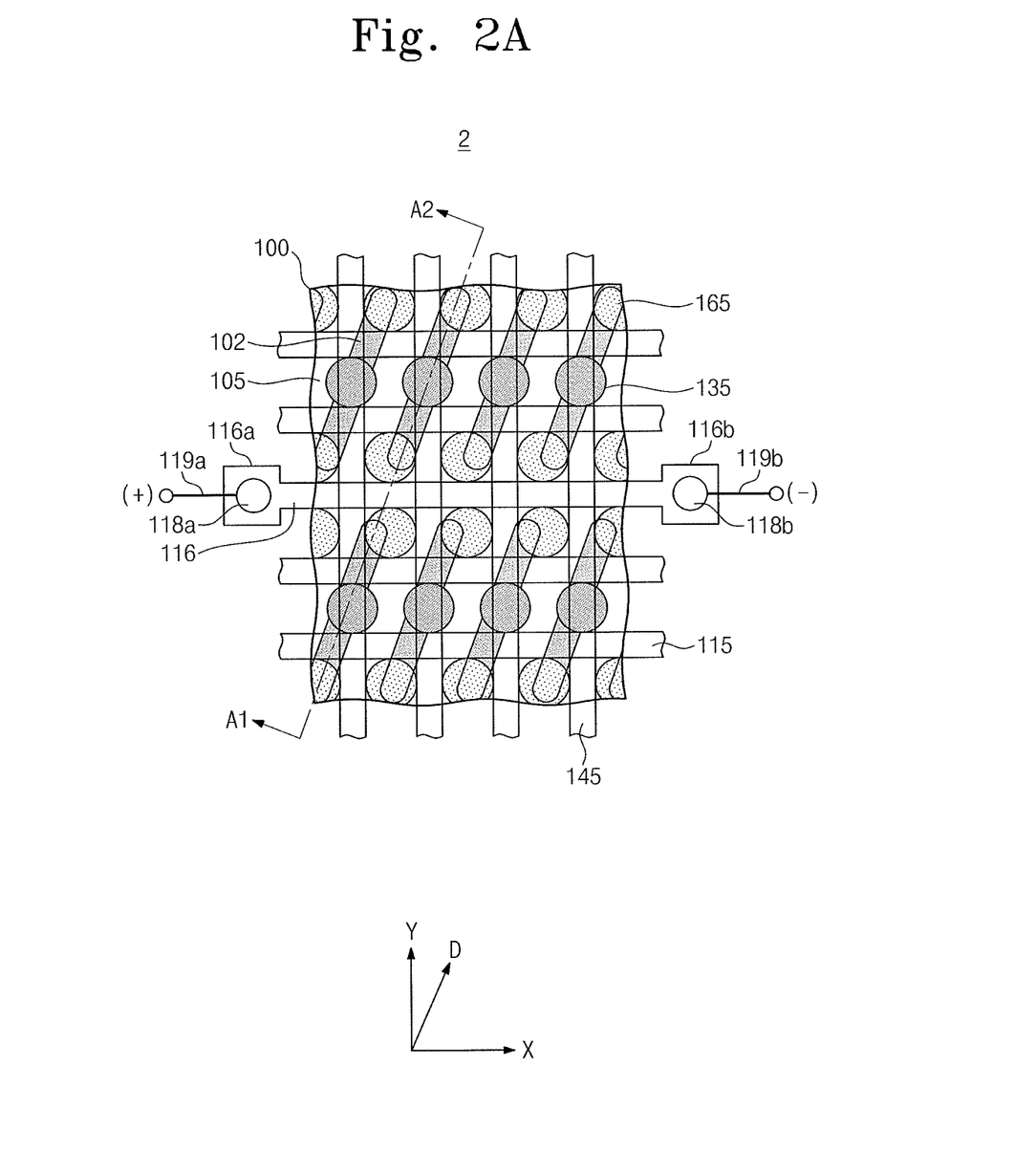
FIG. 2A illustrates another embodiment of a semiconductor device.
Figure 2B:
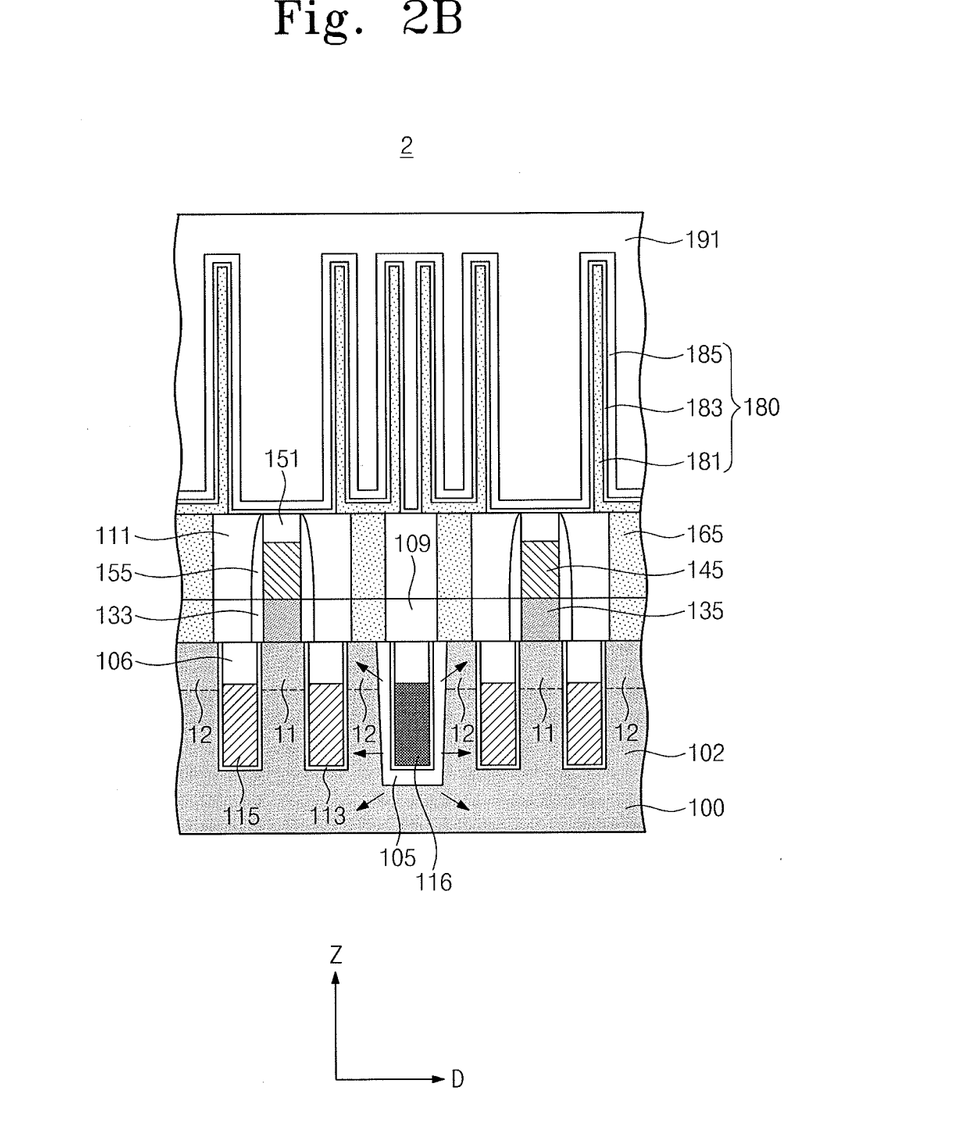
FIG. 2B illustrates a view taken along section line A1-A2 of FIG. 2A.

FIG. 2A illustrates another embodiment of a semiconductor device 2, and FIG. 2B illustrates a cross-sectional view taken along line A1-A2 of FIG. 2A. Referring to FIGS. 2A and 2B, semiconductor device 2 includes a plurality of word lines 115 extending in a first horizontal direction X, a plurality of bit lines 145 extending in a second horizontal direction Y, and active regions 102. Each of the active regions 102 have a predetermined shape (e.g., an island shape) extending in a diagonal direction D. In other embodiments, active regions 103 may have a different shape.

The active regions 102 may be arranged in the first horizontal direction X to overlap, or completely overlap, each other along the first horizontal direction X. As shown in FIG. 2A, bit lines 145 may cross central portions of active regions 102. The word lines 115 may cross edges of active regions 102. For example, a pair of two word lines 115 may cross both edges of the active regions 102.

The semiconductor device 2 may further include an isolation word line 116. The isolation word line 116 may be disposed between a pair of adjacent word lines 115. For example, as shown in FIG. 2A, two word lines 115, one isolation word line 116, and two word lines 115 may be arranged in the second horizontal direction Y in that order. The isolation word line 116 may not overlap active regions 102 in a vertical direction Z.

For example, as shown in FIGS. 2A and 2B, a device isolation layer 105 may extend in the first horizontal direction X between the active regions 102 disposed adjacent to each other in the second horizontal direction Y. In one embodiment, device isolation layer 105 may continuously extend in this position. In other embodiments, device isolation layer may be formed of shorter segments. The isolation word line 116 may not cross active regions 102, but rather may be buried in device isolation layer 105.

According to some embodiments, the isolation word line 116 may be configured to be self-heatable. For example, as shown in FIG. 2A, the isolation word line 116 may include an end portion (i.e., a first pad 116*a*) to which a positive voltage is supplied through a first wire 119*a*, which is electrically connected to the first pad 116*a* by a first contact 118*a*. An opposite end portion (i.e., a second pad 116*b*) may receive a negative voltage supplied through a second wire 119*b*, which is electrically connected to the second pad 116*b* by a second contact 118*b*. The first wire 119*a* may be electrically connected to a positive voltage generation circuit, and the second wire 119*b* may be electrically connected to a negative voltage generation circuit.

Because the different polarity voltages are supplied to respective ends of the isolation word line 116, the isolation word of line 116 may be joule-heated to generate heat (designated as an arrow of FIG. 2B). The self-heating may be performed when the semiconductor device 2 is in a predetermined state, e.g., a standby state. The self-heating of isolation word line 116 may correct the degradation in an electrical property of semiconductor device 2, e.g., may correct refresh and/or retention time degradation.

All of the word lines 115 may be configured to be supplied with one polarity voltage. Alternatively, similar to FIGS. 1A to 1D, at least one of the word lines 115 may be configured to be self-heatable in a manner similar to isolation word line 116. In another example, in a manner similar to FIG. 1E, semiconductor device 2 may include at least one self-heatable dummy word line disposed outside a cell block.

Third Embodiment

Figure 3A:
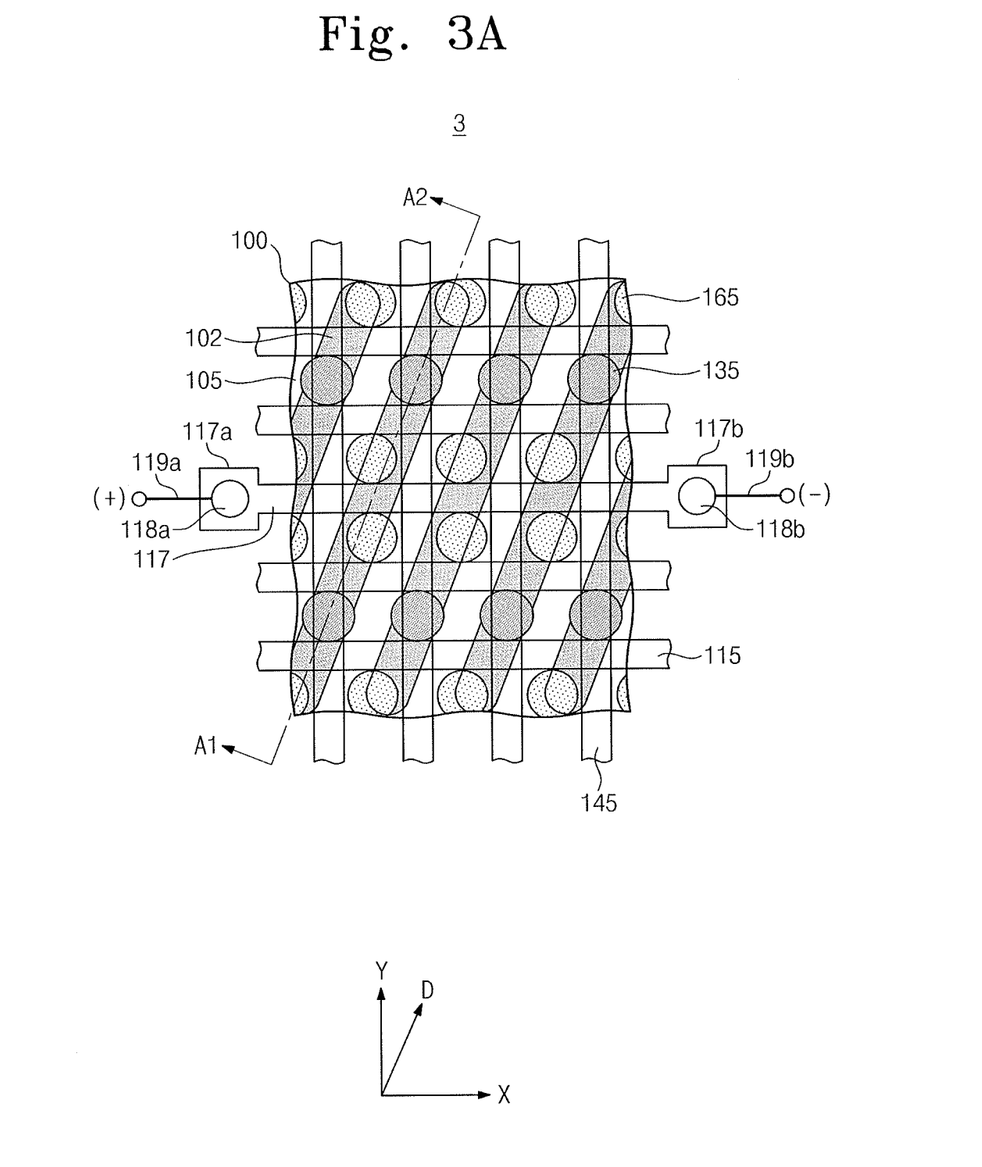
FIG. 3A illustrates another embodiment of a semiconductor device.
Figure 3B:
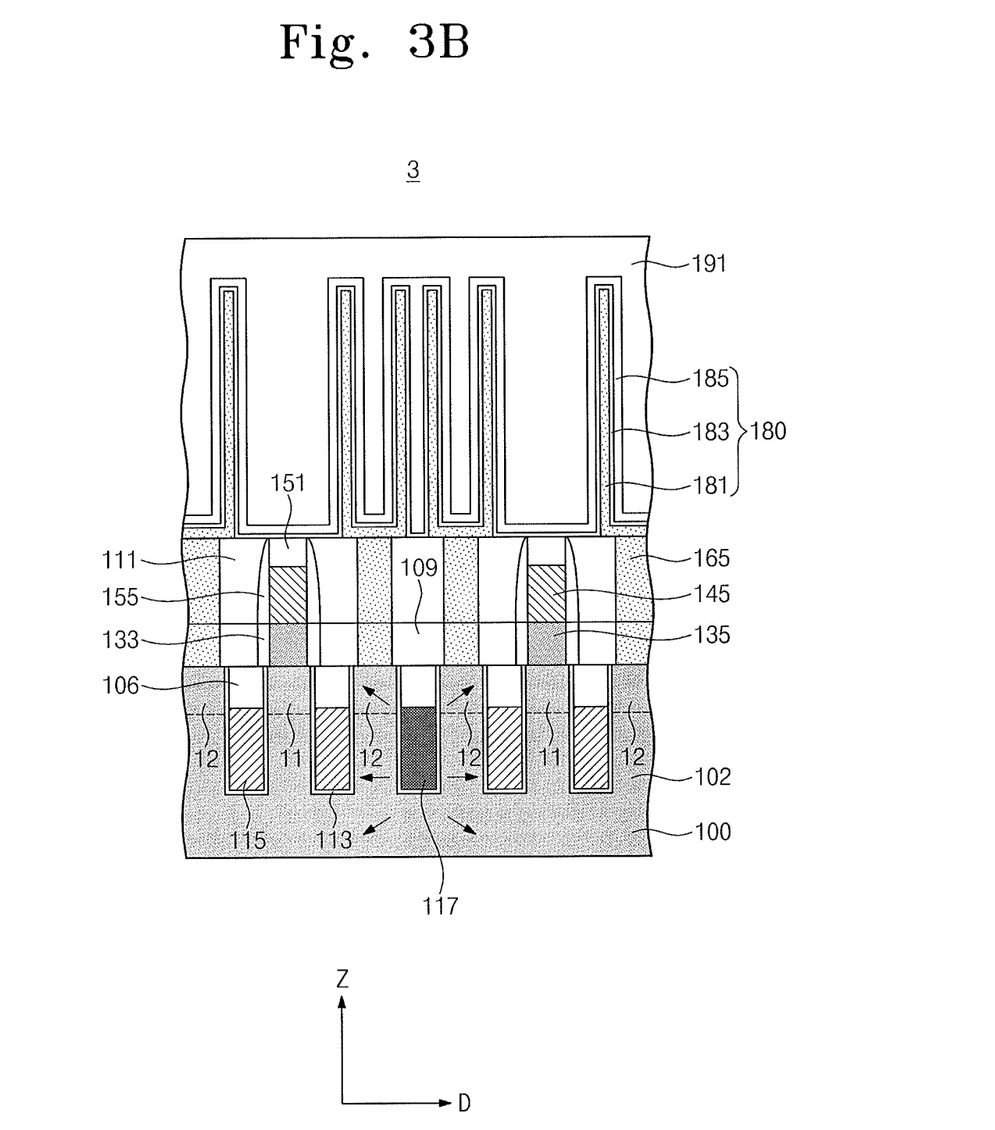
FIG. 3B illustrates a view taken along section line A1-A2 of FIG. 3A.

FIG. 3A illustrates another embodiment of a semiconductor device 3, and FIG. 3B illustrates a cross-sectional view taken along line A1-A2 of FIG. 3A. Referring to FIGS. 3A and 3B, semiconductor device 3 may include a plurality of word lines 115 extending in a first horizontal direction X, a plurality of bit lines 145 extending in a second horizontal direction Y, and active regions 102. Each of the active regions 102 have a predetermined shape, in this case a line shape, extending in a diagonal direction D. In other embodiments, active regions may have a different shape. The semiconductor device 3 may further include an isolation word line 117 disposed between a pair of adjacent word lines 115.

For example, as shown in FIG. 3A, two word lines 115, one isolation word line 117, and two word lines 115 may be arranged in the second horizontal direction Y in that order.

The isolation word line 117 may electrically isolate word lines 115 which are disposed adjacent to each other, with isolation word line 117 therebetween.

For example, when a positive voltage is applied to one end of at least one word line 115 to operate semiconductor device 3, a negative voltage may be applied to an end of isolation word line 117. Because current does not flow under isolation word line 117, current is prevented from flowing between adjacent word lines 115 that include the isolation word line 117 therebetween.

According to some embodiments, the isolation word line 117 may be configured to be self-heatable. For example, as shown in FIG. 3A, the isolation word line 117 may include an end portion (i.e., a first pad 117a) to which a positive voltage is supplied through a first wire 119a, which is electrically connected to the first pad 117a by a first contact 118a. An opposite end portion (i.e., a second pad 117b) of the isolation word line 117 may receive a negative voltage supplied through a second wire 119b, which is electrically connected to the second pad 117b by a second contact 118b. The first wire 119a may be electrically connected to a positive voltage generation circuit, and the second wire 119b may be electrically connected to a negative voltage generation circuit.

Because different polarity voltages are supplied to respective ends of isolation word line 117, the isolation word line 117 may be joule-heated to generate heat (in an arrow direction of FIG. 3B). The self-heating may be performed when semiconductor device 3 is in predetermined state, e.g., a standby state. The degradation in an electrical property of semiconductor device may be corrected by this self-heating, e.g., refresh and/or retention time degradation may be self-curable by the self-heating of isolation word line 117.

All of the word lines 115 may be configured to be supplied with one polarity voltage. Alternatively, similar to FIGS. 1A to 1D, at least one of the word lines 115 may be configured to be self-heatable, like isolation word line 117. In another example, similar to FIG. 1E, semiconductor device 3 may include at least one self-heatable dummy word line disposed outside a cell block.

Application Example

Figure 4:
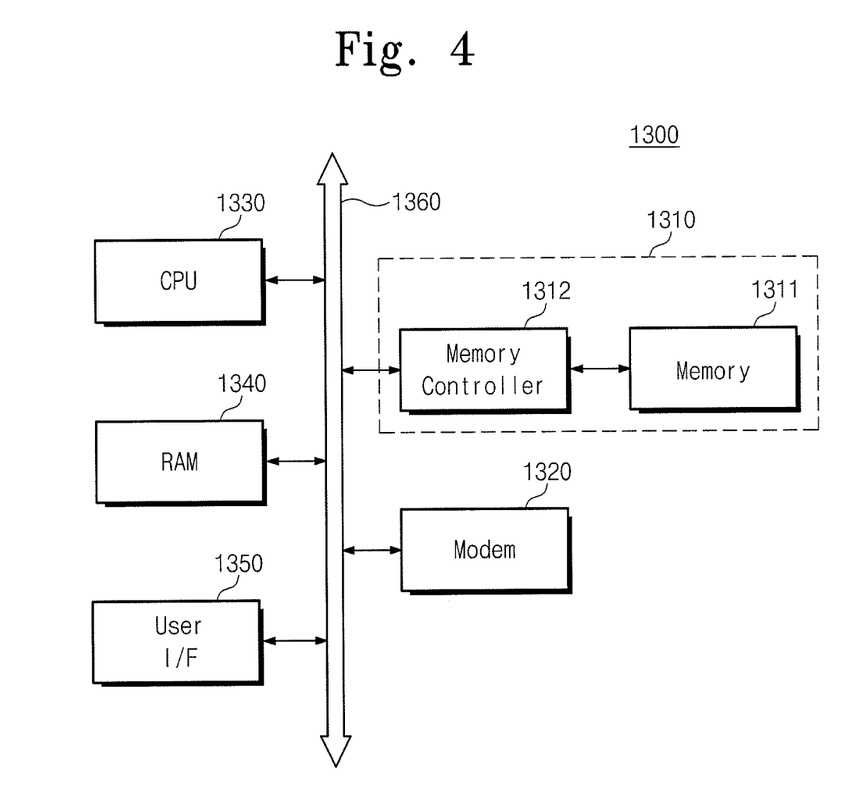
FIG. 4 illustrates an embodiment of an information processing system.

FIG. 4 illustrates an embodiment of an information processing system 1300 which may include one or more of the aforementioned embodiments of the semiconductor device.

Referring to FIG. 4, information processing system 1300 includes a memory system 1310 having at least one semiconductor device 1, 1a, 1b, 1c, 2, and 3 according to the aforementioned embodiments. The information processing system 1300 may also be or include a mobile device or a computer. For example, information processing system 1300 may include a memory system 1310, a modem 1320, a central processing unit (CPU) 1330, a RAM 1340, and a user interface 1350 which are electrically connected to a system bus 1360. The memory system 1310 may include a memory and a memory controller 1312. Data processed by CPU 1330 or data received from an external device may be stored in memory system 1310.

In accordance with one or more of the foregoing embodiments, a self-heating operation is performed on a semiconductor device (e.g., in standby state) without using baking equipment. As a result, degradation in the electrical properties of the semiconductor device may be prevented, to thereby increase the useful life of the semiconductor device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
    a plurality of word lines; and
    a plurality of bit lines which cross the word lines,
    wherein at least one of the word lines includes a first end to which a positive voltage is applied and a second end to which a negative voltage is applied, and wherein the positive and negative voltages are to be applied simultaneously to respective ones of the first and second ends.

2. The device as claimed in claim 1, further comprising:
    a first wire electrically connected to the first end; and
    a second wire electrically connected to the second end,
    wherein the positive voltage is applied to the first end through the first wire, and
    wherein the negative voltage is applied to the second end through the second wire.

3. The device as claimed in claim 1, wherein the at least one word line comprises a dummy or isolation word line.

4. The device as claimed in claim 1, further comprising:
    a substrate having active regions, each of the active regions having an island shape extending in a third direction which crosses a first direction in which the word lines extend and a second direction in which the bit lines extend.

5. The device as claimed in claim 4, wherein the active regions are arranged in a zigzag pattern in the first direction and partially overlap each other in the first direction.

6. The device as claimed in claim 4, wherein the active regions are arranged in a row in the first direction and overlap each other in the first direction.

7. The device as claimed in claim 6, wherein:
    the substrate includes a device isolation layer extending in the first direction, and
    the at least one word line is buried in the device isolation layer and extends without crossing the active regions.

8. The device as claimed in claim 1, further comprising:
    a substrate including active regions, each of the active regions having substantially a line shape extending in a third direction which crosses a first direction in which the word lines extend and a second direction in which the bit lines extend.

9. The device as claimed in claim 1, further comprising:
    a substrate including active regions defined by an isolation layer,
    wherein the word lines are buried in the device isolation layer and extend in a first direction, and wherein the bit lines are disposed on the substrate and extend in a second direction crossing the first direction.

10. The device as claimed in claim 1, further comprising:
    capacitors electrically connected to a substrate;
    node contacts electrically connecting the capacitors to the substrate; and
    bit line contacts electrically connecting the bit lines to the substrate.

11. A semiconductor device, comprising:
a semiconductor substrate including active regions defined by a device isolation layer;
word lines extending to cross the active regions in a first direction; and
bit lines extending to cross the active regions in a second direction different from the first direction and crossing the word lines, wherein at least one of the word lines is self-heated when voltages are applied simultaneously to respective ends of the at least one word line, the voltages having polarities different from each other.

12. The device as claimed in claim 11, wherein:
the active regions extend in a third direction crossing the first and second directions and have island shapes arranged in a zigzag pattern in the first direction,
the bit lines extend to cross central portions of the active regions, and
the word lines extend to cross edges of the active regions.

13. The device as claimed in claim 11, wherein:
the active regions extend in a third direction crossing the first and second directions and have island shapes arranged in a row in the first direction,
the bit lines extend to cross central portions of the active regions, and
the at least one word line is buried in the device isolation layer between adjacent ones of the active regions in the second direction and extend without crossing the active regions, and other word lines extend to cross edges of the active regions.

14. The device as claimed in claim 11, wherein:
the active regions have a line shape extending in a third direction crossing the first and second directions,
the word lines and the bit lines extend to cross the active regions, and
at least one word line electrically isolates adjacent word lines from each other, wherein the at least word line is located between the adjacent word lines.

15. The device as claimed in claim 11, wherein:
the semiconductor substrate comprises a cell block,
the at least one word line is disposed outside the cell block,
other word lines and the bit lines are disposed within the cell block.

16. A semiconductor device, comprising:
a plurality of first signal lines; and
a plurality of second signal lines crossing the first signal lines,
wherein at least one of the first signal lines has a first end to receive a first voltage and a second end to receive a second voltage, wherein the first and second voltages are applied simultaneously to respective ones of the first and second ends, and wherein a difference between the first and second voltages causes joule heating in the at least one first signal line.

17. The device as claimed in claim 16, wherein the difference between the first and second voltages reduces electrical or thermal stress in an area including or adjacent to the at least one first signal line.

18. The device as claimed in claim 16, wherein the first signal lines are word lines and the second signal lines are bit lines.

19. The device as claimed in claim 16, wherein the first signal lines are dummy signal lines.

20. The device as claimed in claim 16, wherein the semiconductor device is a memory.

* * * * *